(12) United States Patent
Sasaki et al.

(10) Patent No.: US 7,855,556 B2
(45) Date of Patent: Dec. 21, 2010

(54) MAGNETIC SENSOR AND MAGNETIC SENSOR MODULE

(75) Inventors: Hiromitsu Sasaki, Niigata-ken (JP); Hideto Ando, Niigata-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 12/819,870

(22) Filed: Jun. 21, 2010

(65) Prior Publication Data

US 2010/0253330 A1    Oct. 7, 2010

Related U.S. Application Data

(63) Continuation of application No. PCT/JP2008/072919, filed on Dec. 17, 2008.

(30) Foreign Application Priority Data

Dec. 28, 2007 (JP) .............................. 2007-339501
Jun. 11, 2008 (JP) .............................. 2008-152705

(51) Int. Cl.
G01R 33/09 (2006.01)
H01L 43/08 (2006.01)

(52) U.S. Cl. ..................................................... 324/252

(58) Field of Classification Search ................ 324/252, 324/207.21; 338/32 R; 360/313
See application file for complete search history.

(56) References Cited

U.S. PATENT DOCUMENTS 5,686,837 A * 11/1997 Coehoorn et al. ........... 324/252

6,326,782 B1 * 12/2001 Schroeder ............... 324/207.21
6,335,675 B1 * 1/2002 Kakinuma et al. ......... 338/32 R
2006/0139025 A1 * 6/2006 Jeffers .................... 324/207.21

FOREIGN PATENT DOCUMENTS

JP        05281319    * 10/1993 ................. 324/251
JP        2005-183614    7/2005

OTHER PUBLICATIONS

International Search Report issued in corresponding PCT Application No. PCT/JP2008/072919; mailed Mar. 17, 2009.

* cited by examiner

Primary Examiner—Kenneth J Whittington
(74) Attorney, Agent, or Firm—Brinks Hofer Gilson & Lione

(57) ABSTRACT

A magnetic sensor including a magnetoresistive effect element has the following structure. Element units each having an element width W1 and an element length L1 perpendicular to the element width W1 and producing a magnetoresistive effect in which electrical resistance changes in response to an external magnetic field are arranged in an element-length direction with a space therebetween. An intermediate permanent magnet layer is disposed in the space, and the element units are connected to each other with the intermediate permanent magnet layer therebetween to form a connected-element body. A plurality of the connected-element bodies are arranged so as to be adjacent to one another in an element-width direction with a space therebetween, the ends of the connected-element bodies are connected to each other with an outer permanent magnet layer therebetween to form a magnetoresistive effect element having a meandering shape.

11 Claims, 11 Drawing Sheets

MAGNETIC SENSOR AND MAGNETIC SENSOR MODULE

CLAIM OF PRIORITY

This application is a Continuation of International Application No. PCT/JP2008/072919 filed on Dec. 17, 2008, which claims benefit of the Japanese Patent Applications No. 2008-152705 filed on Jun. 11, 2008 and No. 2007-339501 filed on Dec. 28, 2007, both of which are hereby incorporated by reference.

BACKGROUND OF THE INVENTION

1. Field of the Invention

The present invention relates to a magnetic sensor that uses a magnetoresistive effect element used as, for example, a geomagnetic sensor.

2. Description of the Related Art

A magnetic sensor that uses a magnetoresistive effect element can be used as, for example, a geomagnetic sensor configured to detect geomagnetism and mounted in a mobile apparatus such as a cellular phone. In the magnetoresistive effect element, an electrical resistance value changes in response to the magnetic field intensity in a sensitivity axis direction.

As disclosed in Japanese Unexamined Patent Application Publication No. 2005-183614, a magnetoresistive effect element includes a plurality of element units (magnetoresistive effect layers 6 in Japanese Unexamined Patent Application Publication No. 2005-183614) and permanent magnet layers connecting the ends of the element units to each other and has a meandering shape. The magnetoresistive effect element is formed in a meandering shape because an element with a large length has a large element resistance and thus power consumption can be reduced.

However, the magnetic sensor having the above-described structure poses the following problems.

As shown in FIG. 13, the number of times the element units 40 are made to reverse direction using permanent magnet layers 41 is increased and thus a magnetoresistive effect element that excessively extends in a sensitivity axis direction (a fixed magnetization direction (P direction) of a fixed magnetic layer) is formed. In particular, as shown in FIG. 14, when the magnetic sensor is used for detecting a magnetic field in the height direction (Z direction) of a geomagnetic sensor, the magnetoresistive effect element is formed so as to extend in the height direction, which is a sensitivity axis direction. Therefore, there is a problem in that the thickness T6 of a Z axis magnetic field detection unit 42 in the height direction is excessively increased.

Furthermore, if the individual element units 40 are formed so as to have a large length in the element-length direction (longitudinal direction), a bias magnetic field generated from the permanent magnet layers 41 disposed on both sides of the element units 40 in the longitudinal direction does not effectively act around the center of each of the element units 40. As a result, hysteresis occurs and the linearity of the ratio (MR ratio) of change in resistance to an external magnetic field in the sensitivity axis direction tends to decrease.

SUMMARY

In view of the foregoing, the present invention provides a magnetic sensor that has as large an element resistance as in the related art, in which the length of a magnetoresistive effect element in a sensitivity axis direction can be suitably decreased, and that can suitably provide a bias magnetic field to element units.

In the present invention, a magnetic sensor includes a magnetoresistive effect element, wherein the magnetoresistive effect element includes a plurality of connected-element bodies arranged so as to be adjacent to one another in an element-width direction with a space therebetween and an outer permanent magnet layer disposed at ends of the connected-element bodies in a longitudinal direction, the ends of the connected-element bodies being electrically connected to each other with the outer permanent magnet layer therebetween to form a meandering shape; the plurality of connected-element bodies each include a plurality of element units arranged in an element-length direction with a space therebetween and an intermediate permanent magnet layer disposed in the space, the element units being connected to each other so as to sandwich the intermediate permanent magnet layer; and the element units each have an element width W1 and an element length L1 perpendicular to the element width W1 and produce a magnetoresistive effect in which electrical resistance changes in response to an external magnetic field.

This can provide as large an element resistance as in the related art, can suitably decrease the length of a magnetoresistive effect element in a sensitivity axis direction, and can suitably provide a bias magnetic field to the element units.

In the present invention, the length L3 of the intermediate permanent magnet layer in the element-length direction is preferably smaller than the element length L1 of the element units. This can decrease the resistance of the intermediate permanent magnet layer.

In the present invention, the length L3 of the intermediate permanent magnet layer in the element-length direction is preferably smaller than the length L4 of the outer permanent magnet layer in the element-length direction. In this case, a bias magnetic field can be uniformly provided to the element units constituting the connected-element bodies and thus the ratio (MR ratio) of change in resistance to an external magnetic field in a sensitivity axis direction can have satisfactory linearity.

In the present invention, a low resistance layer having a resistance value lower than that of the intermediate permanent magnet layer and that of the outer permanent magnet layer is preferably formed on the intermediate permanent magnet layer and the outer permanent magnet layer. This can decrease the parasitic resistance other than element resistance.

In the present invention, the magnetic sensor preferably further includes a fixed resistance element serially connected to the magnetoresistive effect element with an output extracting unit therebetween, wherein the fixed resistance element includes a plurality of connected-element bodies each formed by connecting a plurality of element units, whose electrical resistance does not change in response to an external magnetic field, to each other with an intermediate permanent magnet layer therebetween in the same manner as the magnetoresistive effect element, and the ends of the connected-element bodies are electrically connected to each other with an outer permanent magnet layer therebetween so as to form a meandering shape.

In particular, the element units constituting the fixed resistance element are preferably composed of the same stacking component as that of the element units constituting the magnetoresistive effect element. In this case, the temperature coefficients of resistance (TCR) of the magnetoresistive effect element and the fixed resistance element can be equalized. The same stacking component herein constitutes a structure for providing the same temperature coefficient of resistance. Even if the order of layers stacked is changed or a magnetization direction is changed, the same advantages can be produced.

In the present invention, pad portions electrically connected to a sensor portion including the magnetoresistive effect element and the fixed resistance element are preferably all formed on only one side relative to the sensor portion. In this case, the pad portions can be efficiently arranged in a limited space, which can downsize the magnetic sensor.

In the present invention, preferably, the element units constituting the magnetoresistive effect element each include a fixed magnetic layer whose magnetization direction is fixed and a free magnetic layer whose magnetization direction is changed in response to an external magnetic field, the free magnetic layer being stacked on a nonmagnetic layer stacked on the fixed magnetic layer, and a fixed magnetization direction of the fixed magnetic layer is the element-width direction, the element-width direction being a sensitivity axis direction.

A magnetic sensor module includes a plurality of the magnetic sensors described above, wherein magnetoresistive effect elements are arranged such that sensitivity axes of at least a pair of the magnetoresistive effect elements included in the plurality of the magnetic sensors are perpendicular to each other.

The magnetic sensor module may be formed as a package having a substantially plate-like shape, and a surface on which at least one of the magnetoresistive effect elements included in the plurality of the magnetic sensors is formed may be perpendicular to a plate surface of the package. In this case, the magnetic sensor module is preferably a geomagnetic sensor configured to detect geomagnetisms in directions of an X axis, a Y axis, and a Z axis (height direction), the X axis and the Y axis being perpendicular to each other in a plane, the plane being perpendicular to the Z axis. This can decrease the height of the magnetic sensor module.

DESCRIPTION OF THE PREFERRED EMBODIMENTS

Figure 1A:
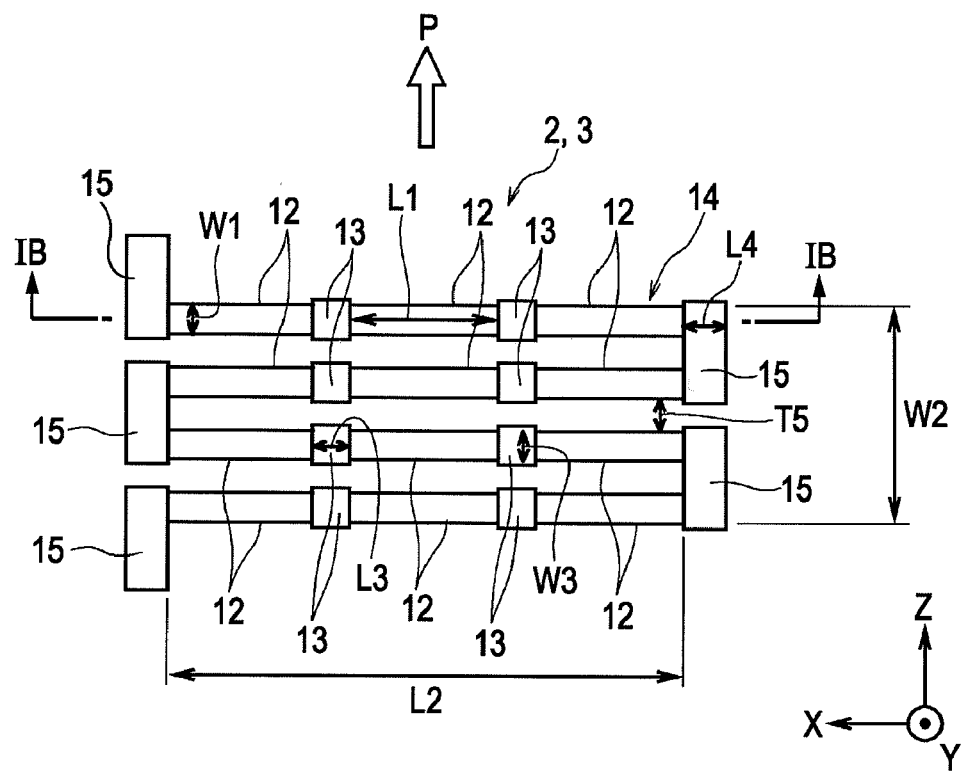
FIG. 1A is a partial plan view particularly showing a part of a magnetoresistive effect element of a magnetic sensor according to this embodiment.
Figure 1B:
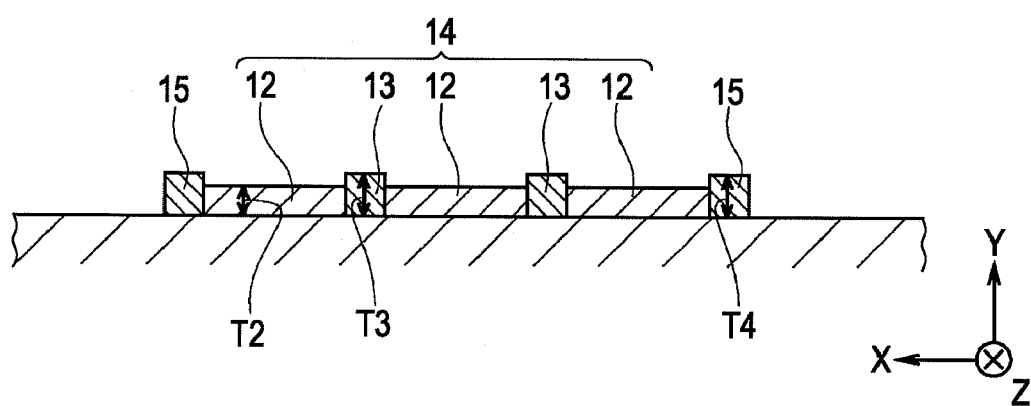
FIG. 1B is a partial sectional view taken along line IB-IB of FIG. 1A in a height direction (Z direction in the drawing), the partial sectional view being seen in an arrow direction.
Figure 2:
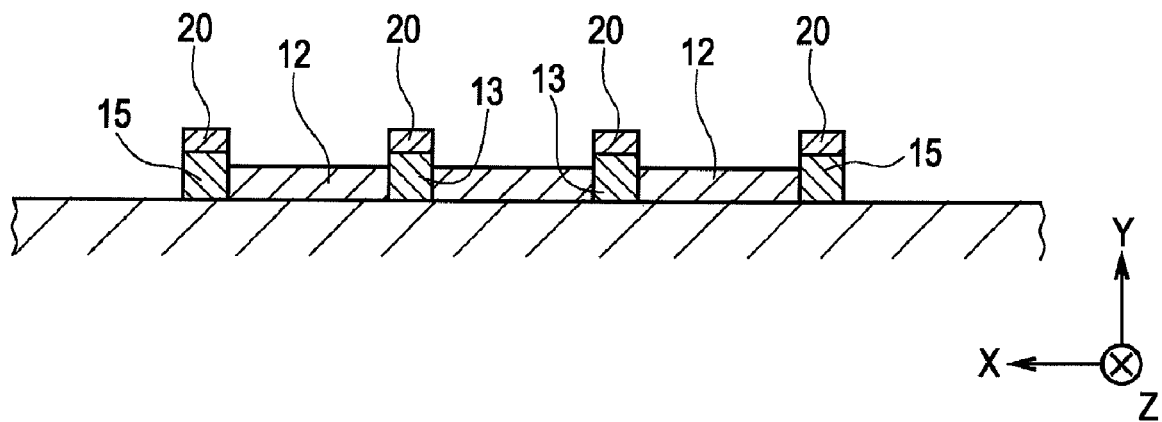
FIG. 2 is a partial sectional view of a magnetic sensor according to an embodiment different from that of FIG. 1B.
Figure 3:
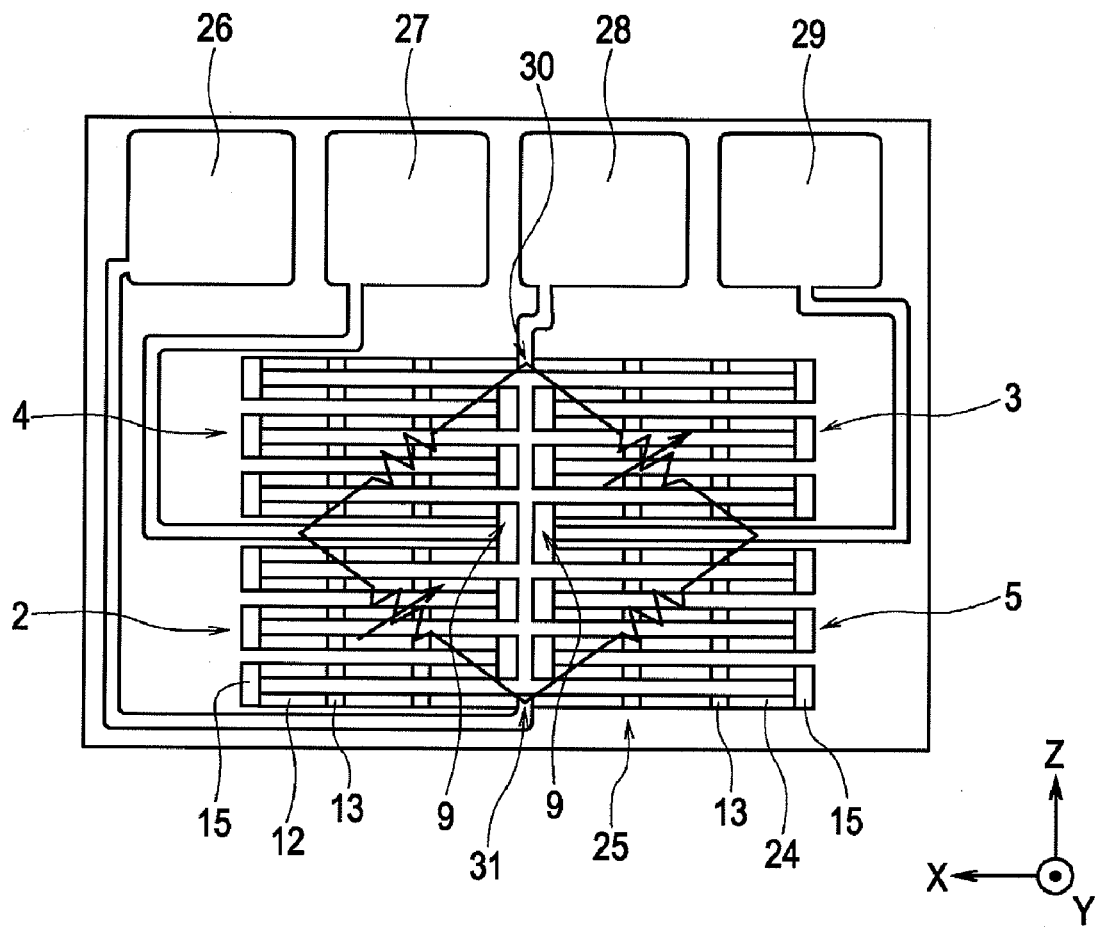
FIG. 3 is a partial plan view showing a sensor portion (bridge circuit) formed by connecting magnetoresistive effect elements and fixed resistance elements to each other and pad portions electrically connected to the sensor portion.
Figure 4:
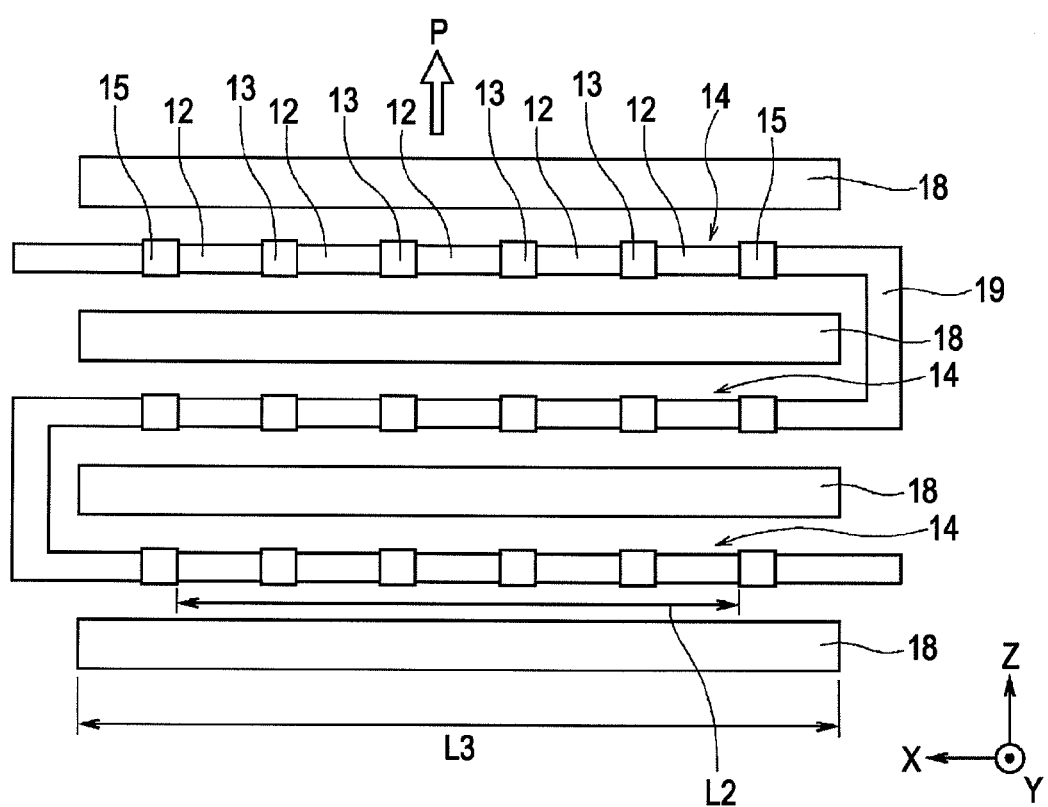
FIG. 4 is a plan view particularly showing a part of a magnetoresistive effect element of a magnetic sensor according to an embodiment different from that of FIG. 1A.
Figure 5:
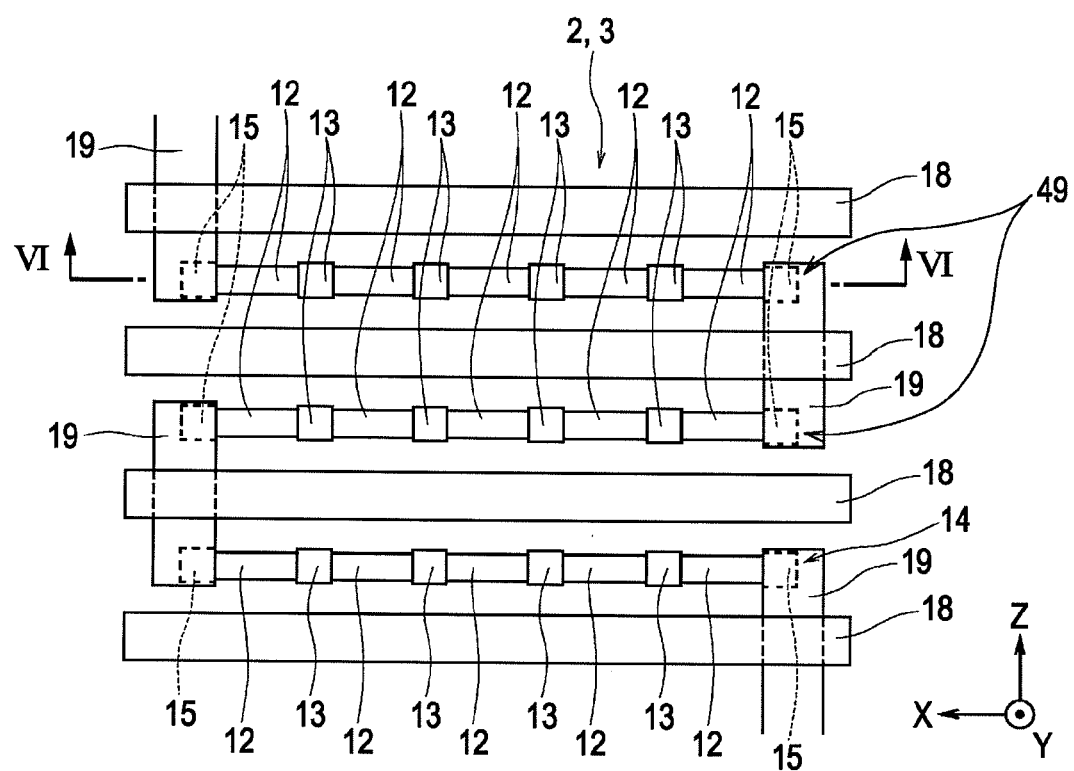
FIG. 5 is a plan view particularly showing a part of a magnetoresistive effect element of a magnetic sensor according to an embodiment different from that of FIG. 1A.
Figure 6:
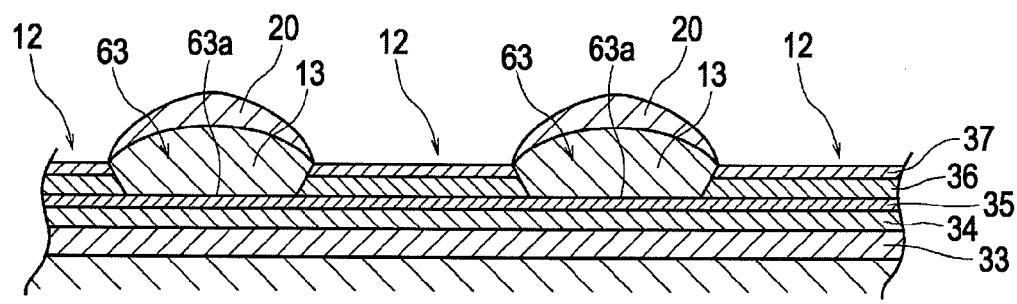
FIG. 6 is a partially enlarged sectional view taken along line VI-VI of FIG. 5 in a height direction (Z direction in the drawing), the partially enlarged sectional view being seen in an arrow direction.
Figure 7:
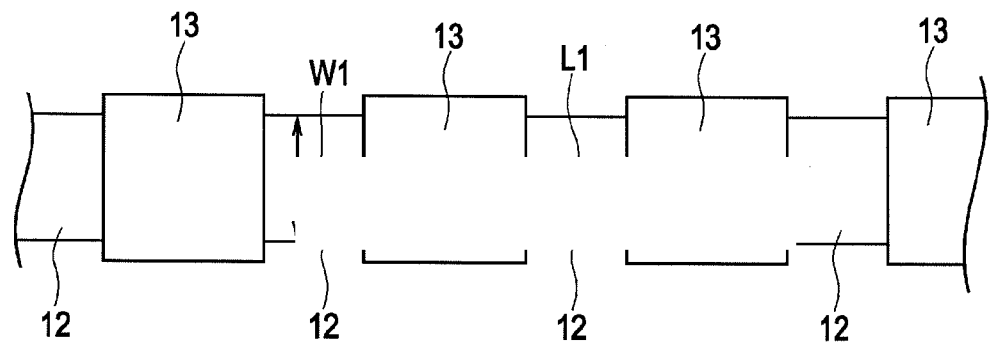
FIG. 7 is a partially enlarged plan view particularly showing an element unit in a preferable structure of a magnetoresistive effect element.
Figure 8:
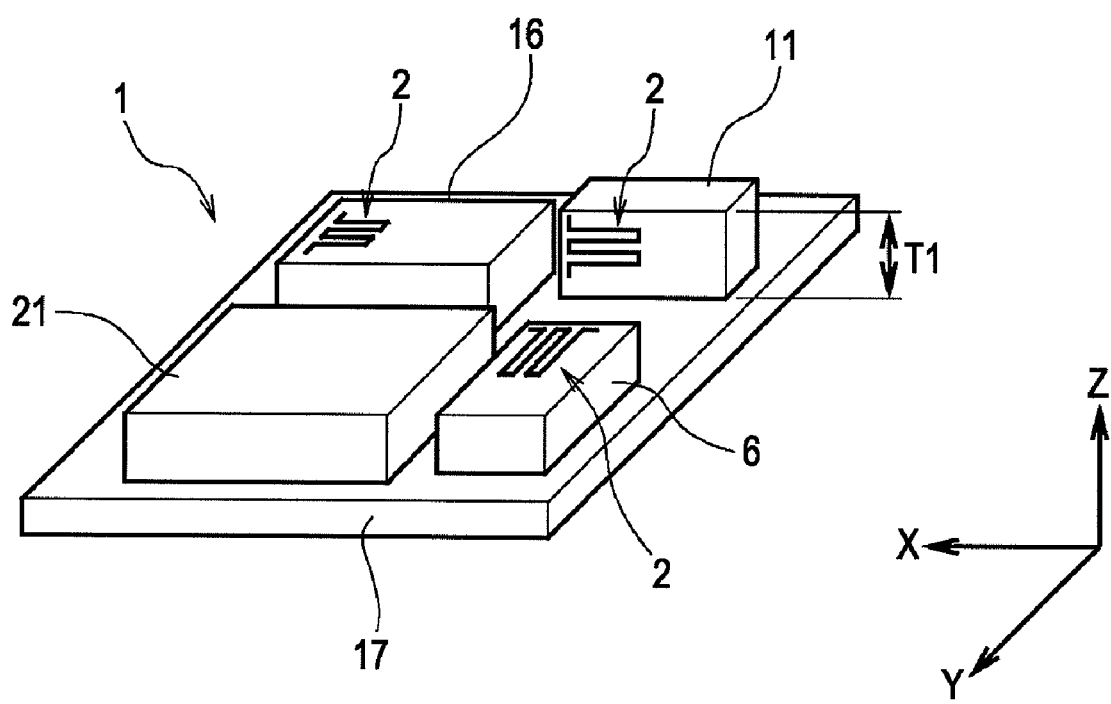
FIG. 8 is a partial perspective view of a geomagnetic sensor in this embodiment.
Figure 9:
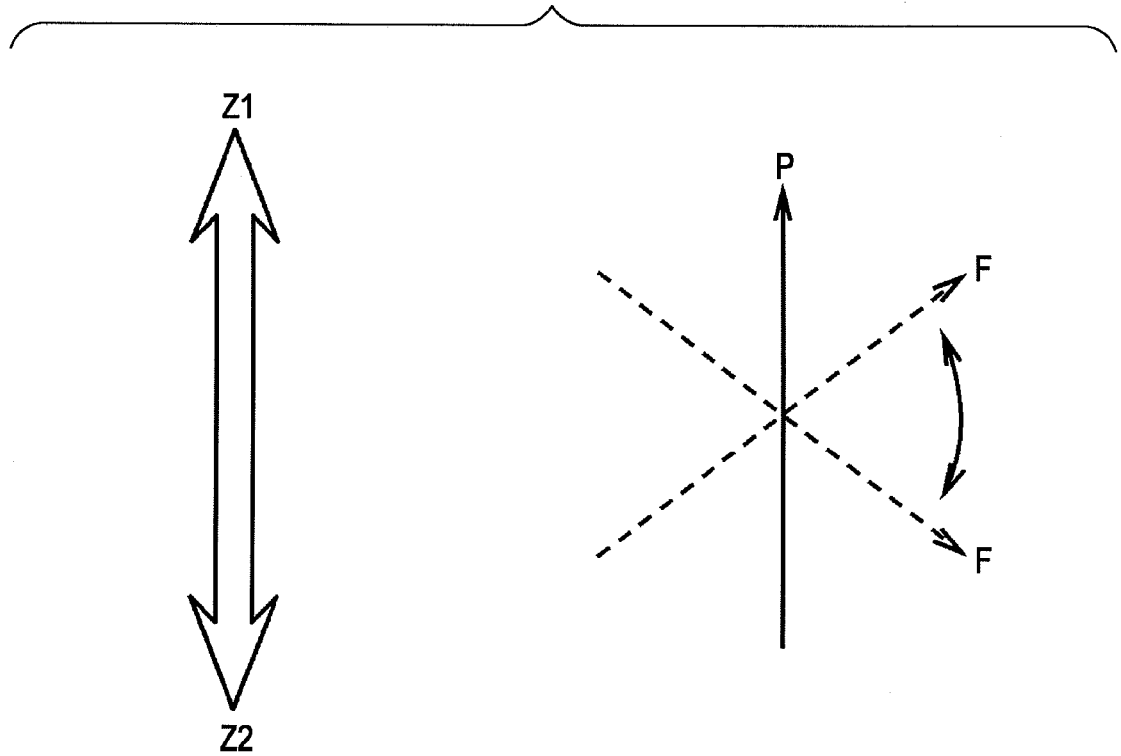
FIG. 9 is a diagram describing the relationship between an electrical resistance value and the fixed magnetization direction of a fixed magnetic layer and the magnetization direction of a free magnetic layer of a magnetoresistive effect element.
Figure 10:
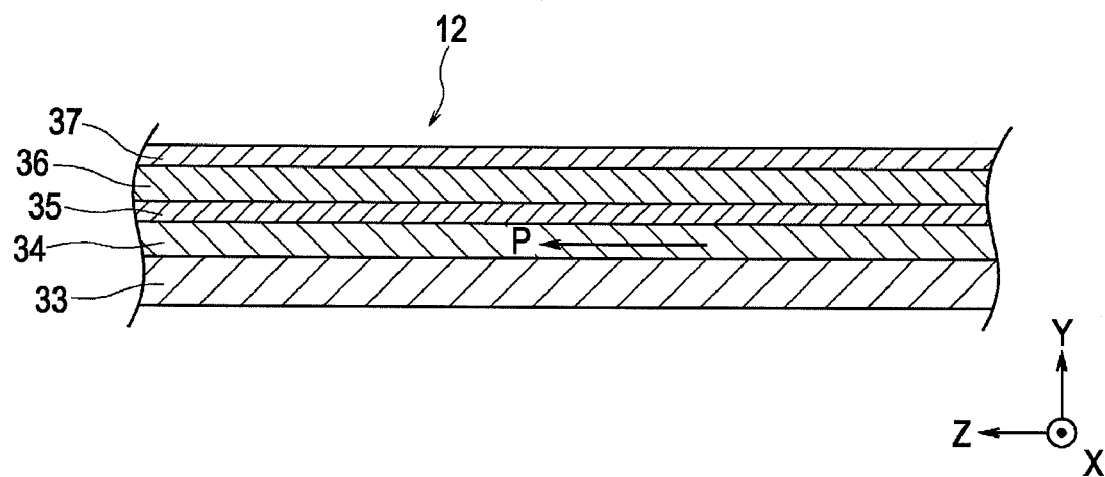
FIG. 10 is a sectional view showing a section obtained by cutting the magnetoresistive effect element in a thickness direction.
Figure 11:
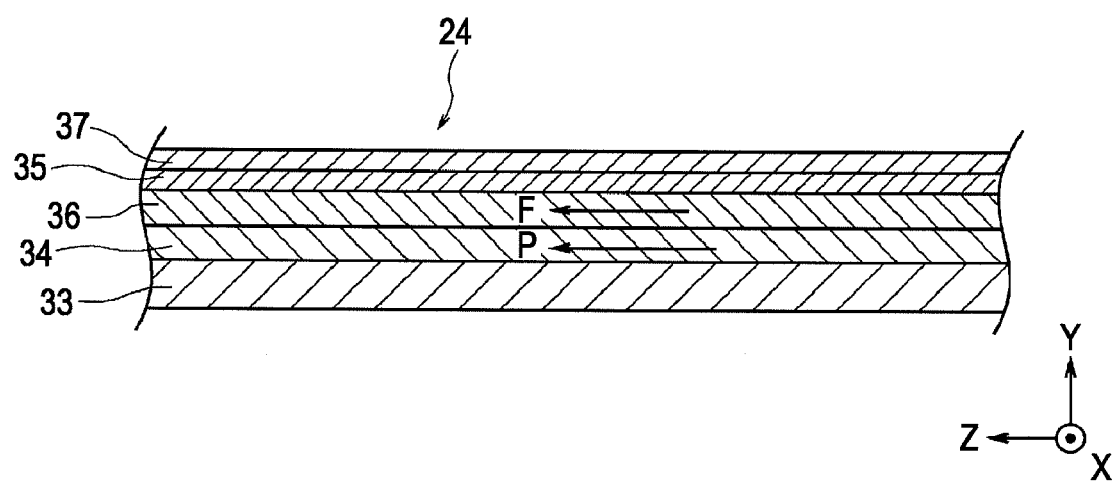
FIG. 11 is a sectional view showing a section obtained by cutting the fixed resistance element in a thickness direction.

FIG. 1A is a partial plan view particularly showing a part of a magnetoresistive effect element of a magnetic sensor according to this embodiment and FIG. 1B is a partial sectional view taken along line IB-IB of FIG. 1A in a height direction (Z direction in the drawing), the partial sectional view being seen in an arrow direction. FIG. 2 is a partial sectional view of a magnetic sensor according to an embodiment different from that of FIG. 1B. FIG. 3 is a partial plan view showing a sensor portion (bridge circuit) formed by connecting magnetoresistive effect elements and fixed resistance elements to each other and pad portions electrically connected to the sensor portion. FIG. 4 is a plan view particularly showing a part of a magnetoresistive effect element of a magnetic sensor according to an embodiment different from that of FIG. 1A. FIG. 5 is a plan view particularly showing a part of a magnetoresistive effect element of a magnetic sensor according to an embodiment different from that of FIG. 1A. FIG. 6 is a partially enlarged sectional view taken along line VI-VI of FIG. 5 in a height direction (Z direction in the drawing), the partially enlarged sectional view being seen in an arrow direction. FIG. 7 is a partially enlarged plan view particularly showing an element unit in a preferable structure of a magnetoresistive effect element. FIG. 8 is a partial perspective view of a geomagnetic sensor (magnetic sensor module) in this embodiment. FIG. 9 is a diagram describing the relationship between an electrical resistance value and the fixed magnetization direction of a fixed magnetic layer and the magnetization direction of a free magnetic layer of a magnetoresistive effect element. FIG. 10 is a sectional view showing a section obtained by cutting the magnetoresistive effect element in a thickness direction. FIG. 11 is a sectional view showing a section obtained by cutting the fixed resistance element in a thickness direction.

A magnetic sensor 1 (hereinafter may be referred to as "geomagnetic sensor 1") including a magnetoresistive effect element and a fixed resistance element in this embodiment is used as a geomagnetic sensor mounted in a mobile apparatus such as a cellular phone.

As shown in FIG. 8, the geomagnetic sensor 1 includes an X axis magnetic field detection unit 6, a Y axis magnetic field detection unit 16, a Z axis magnetic field detection unit 11, and an application-specific integrated circuit (ASIC) 21, all of which are disposed on a base 17. Each of the magnetic field detection units 6, 16, and 11 includes a bridge circuit constituted by magnetoresistive effect elements 2 and 3 and fixed resistance elements 4 and 5 (refer to FIG. 3). In FIG. 8, only a single magnetoresistive effect element 2 is illustrated for each of the magnetic field detection units 6, 16, and 11. The magnetoresistive effect elements 2 are formed in the same meandering shape and face in different directions.

A structure of the magnetoresistive effect elements 2 and 3 according to this embodiment will now be described. Herein, the description is made using the magnetoresistive effect elements 2 and 3 disposed in the Z axis magnetic field detection unit 11. As shown in FIG. 8, in the Z axis magnetic field detection unit 11, the magnetoresistive effect element 2 is formed on an X-Z surface and the Y axis direction is a thickness direction of the magnetoresistive effect element 2.

As shown in FIG. 1A, the magnetoresistive effect elements 2 and 3 include element units 12 with an element width W1 and an element length L1 that is perpendicular to the element width W1, intermediate permanent magnet layers 13, and outer permanent magnet layers 15. The intermediate permanent magnet layers 13 and the outer permanent magnet layers 15 are composed of CoPt, CoPtCr, or the like and formed by, for example, sputtering.

As shown in FIGS. 1A and 1B, two or more element units 12 (e.g., three element units in the drawing) are arranged so as to extend in the element-length direction (X direction) and so as to be adjacent to one another in the element-length direction with spaces formed between the element units 12. The intermediate permanent magnet layers 13 are interposed in the spaces. Thus, there is formed a connected-element body 14 that is obtained by connecting the element units 12 to each other with the intermediate permanent magnet layers 13 therebetween and that extends in the X direction with a belt shape. A plurality of the connected-element bodies 14 are arranged so as to be adjacent to one another in the element-width direction (Z direction) with spaces therebetween. The ends of the connected-element bodies 14 are connected to each other with the outer permanent magnet layer 15 therebetween and thus the magnetoresistive effect elements 2 and 3 having a meandering shape are formed.

The element units 12 constituting the magnetoresistive effect elements 2 and 3 all have the same stacked structure shown in FIG. 10. FIG. 10 is a sectional view taken, in the thickness direction, along a line that extends in a direction parallel to the direction of the element width W1.

Each of the element units 12 is formed by stacking an antiferromagnetic layer 33, a fixed magnetic layer 34, a nonmagnetic layer 35, and a free magnetic layer 36 in that order. The surface of the free magnetic layer 36 is covered with a protective layer 37. The element unit 12 is formed by, for example, sputtering.

The antiferromagnetic layer 33 is composed of an antiferromagnetic material such as an iridium-manganese alloy (Ir—Mn alloy). The fixed magnetic layer 34 is composed of a soft magnetic material such as a cobalt-iron alloy (Co—Fe alloy). The nonmagnetic layer 35 is composed of copper (Cu) or the like. The free magnetic layer 36 is composed of a soft magnetic material such as nickel-iron alloy (Ni—Fe alloy). The protective layer 37 is composed of tantalum (Ta). The structure described above provides a giant magnetoresistive effect element (GMR element) in which the nonmagnetic layer 35 is composed of a nonmagnetic conducive material such as Cu. Alternatively, there may be provided a tunnel magnetoresistive effect element (TMR element) in which the nonmagnetic layer 35 is composed of an insulating material such as Al2O3.

In the element unit 12, a magnetization direction of the fixed magnetic layer 34 is fixed due to an exchange coupling magnetic field (HeX) generated between the antiferromagnetic layer 33 and the fixed magnetic layer 34. As shown in FIGS. 1A and 10, the fixed magnetization direction (P direction) of the fixed magnetic layer 34 is the element-width W1 direction (Z direction). In other words, the fixed magnetization direction (P direction) of the fixed magnetic layer 34 is perpendicular to the element-length direction (longitudinal direction) of the element unit 12.

The magnetization direction (F direction) of the free magnetic layer 36 is aligned with the element-length direction (X direction in the drawing) due to a bias magnetic field that is generated from the intermediate permanent magnet layers 13 and the outer permanent magnet layers 15 and acts in the element-length direction. The magnetization of the free magnetic layer 36 is changed due to an external magnetic field in the sensitivity axis direction (the magnetization direction of the fixed magnetic layer 34, that is, the Z direction).

As shown in FIG. 9, when an external magnetic field Z1 acts in the same direction as the fixed magnetization direction (P direction) of the fixed magnetic layer 34 and the magnetization direction (F direction) of the free magnetic layer 36 is changed to the direction of the external magnetic field Z1, the fixed magnetization direction (P direction) of the fixed magnetic layer 34 becomes nearly parallel to the magnetization direction (F direction) of the free magnetic layer 36, which decreases an electrical resistance value.

In contrast, when an external magnetic field Z2 acts in the direction opposite to the fixed magnetization direction (P direction) of the fixed magnetic layer 34 and the magnetization direction (F direction) of the free magnetic layer 36 is changed to the direction of the external magnetic field Z2, the fixed magnetization direction (P direction) of the fixed magnetic layer 34 becomes nearly antiparallel to the magnetization direction (F direction) of the free magnetic layer 36, which increases an electrical resistance value.

In this embodiment, the plurality of element units 12 are connected to each other via the intermediate permanent magnet layers 13 and the outer permanent magnet layers 15 therebetween so as to have a meandering shape that makes the total element length larger. Therefore, the element resistance can be increased and the power consumption can be decreased.

Furthermore, in this embodiment, the connected-element bodies 14 formed by connecting the plurality of element units 12 with the intermediate permanent magnet layers 13 therebetween are arranged so as to be adjacent to one another in the element-width direction. The ends of the connected-element bodies 14 are connected to each other with the outer permanent magnet layers 15 therebetween. Thus, the size of the magnetoresistive effect elements 2 and 3 in the element-width direction (Z direction) can be decreased compared with the structure in which all the element units 12 are arranged so as to be adjacent to one another in the element-width direction (Z direction) with spaces therebetween and the ends of the element units 12 are connected to each other with the outer permanent magnet layers 15 therebetween (the structure without intermediate permanent magnet layers 13).

As shown in FIG. 1A, the length L2 of the connected-element bodies 14 in the element-length direction (X direction) is larger than the width W2 between the outer surfaces of the connected-element bodies 14 that are located at the outermost positions in the element-width direction.

Accordingly, when the magnetoresistive effect elements 2 and 3 of this embodiment are used for the Z axis magnetic field detection unit 11 of the geomagnetic sensor shown in FIG. 8, the height T1 of the Z axis magnetic field detection unit 11 can be decreased, which can facilitate the reduction in the height of the magnetic sensor 1. By employing the magnetoresistive effect elements 2 and 3 of this embodiment for the X axis magnetic field detection unit 6 and the Y axis magnetic field detection unit 16, the magnetic sensitivities to an external magnetic field can be made equal at the X axis magnetic field detection unit 6, the Y axis magnetic field detection unit 16, and the Z axis magnetic field detection unit 11, which can equalize the detection precision of geomagnetism in each of the directions.

In this embodiment, each of the connected-element bodies 14 includes the plurality of element units 12 and the intermediate permanent magnet layer 13 is interposed between the element units 12. For example, in the structure in which a single element unit 12 is formed between the outer permanent magnet layers 15 in the X direction of the drawing and the intermediate permanent magnet layers 13 are disposed, below the element unit 12 at some points between the outer permanent magnet layers 15 in the X direction, the element unit 12 is bended around the intermediate permanent magnet layers 13. As a result, a bias magnetic field cannot be suitably applied at the bended portions, which decreases the linearity of the ratio (MR ratio) of change in resistance to an external magnetic field or easily causes the variation in linearity.

In contrast, in this embodiment, the element unit 12 located between the outer permanent magnet layers 15 is not simply made to extend in the X direction of the drawing. A plurality of element units 12 are arranged in the X direction on the same plane and the intermediate permanent magnet layers 13 are disposed between the element units 12. Thus, a bias magnetic field can be effectively applied to all the element units 12 constituting the connected-element bodies 14 in the X direction, which can improve the linearity of the ratio (MR ratio) of change in resistance to an external magnetic field.

As in the embodiment shown in FIG. 1A, the element length L1 of the element units 12 is preferably larger than the element width W1 because the length L2 of the connected-element bodies 14 can be suitably and easily adjusted so as to be larger than the width W2 between the outer surfaces of the connected-element bodies 14 that are located at the outermost positions in the element-width direction.

By disposing three or more element units 12 in the connected-element body 14, the connected-element bodies 14 can be formed with a large length L2 and the number of returns in a meandering shape can be decreased. Consequently, the width W2 can be effectively decreased while element resistance that is as large as in the related art is maintained.

In this embodiment, the length L3 of the intermediate permanent magnet layers 13 in the element-length direction (X direction of the drawing) is preferably smaller than the element length L1 of the element units 12 (refer to FIG. 1A). This can decrease the resistance of the intermediate permanent magnet layers 13.

In the case where each of the connected-element bodies 14 includes three or more element units 12 as shown in FIGS. 1A and 1B, the element unit 12 located in the center is subjected to a bias magnetic field from not only the intermediate permanent magnet layers 13 but also the outer permanent magnet layers 15. Therefore, in this embodiment, the length L3 of the intermediate permanent magnet layers 13 is preferably adjusted to be smaller than the length L4 of the outer permanent magnet layers 15 in the element-length direction (X direction of the drawing), whereby a uniform bias magnetic field is easily applied to the element units 12 constituting each of the connected-element body 14.

The sizes of components will be described.

The element width W1 of the element units 12 constituting the magnetoresistive effect elements 2 and 3 is in the range of 2 to 10 μm (refer to FIG. 1A). The element length L1 of the element units 12 is in the range of 4 to 80 μm (refer to FIG. 1A). The thickness T2 of the element units 12 is in the range of 200 to 400 Å (refer to FIG. 1B). The aspect ratio (element length L1/element width W1) of the element units 12 is 0.5 to 10.

The length L3 of the intermediate permanent magnet layers 13 is in the range of 2 to 10 μm (refer to FIG. 1A). The width W3 of the intermediate permanent magnet layers 13 is in the range of 3 to 12 μm (refer to FIG. 1A). The thickness T3 of the intermediate permanent magnet layers 13 is in the range of 150 to 1000 Å (refer to FIG. 1B).

The length L4 of the outer permanent magnet layers 15 is in the range of 5 to 15 μm (refer to FIG. 1A). The thickness T4 of the outer permanent magnet layers 15 is preferably equal to the thickness T3 of the intermediate permanent magnet layers 13 (refer to FIG. 1B).

The space T5 between the connected-element bodies 14 in the element-width direction is in the range of 2 to 10 μm (refer to FIG. 1A).

The length L2 of the connected-element bodies 14 is in the range of 100 to 200 μm. The width W2 between the outer surfaces of the connected-element bodies 14 that are located at the outermost positions in the element-width direction is in the range of 50 to 100 μm.

As in the embodiment shown in FIG. 2, low resistance layers 20 having a resistance value lower than those of the intermediate permanent magnet layers 13 and the outer permanent magnet layers 15 are preferably formed on the permanent magnet layers 13 and 15. The low resistance layers 20 are suitably composed of a nonmagnetic conducive material such as Au, Al, or Cu. The low resistance layers 20 are formed on the permanent magnet layers 13 and 15 by sputtering or plating. To increase the element resistance, the plurality of element units 12 are connected to each other so as to form a meandering shape, but the resistances of the intermediate permanent magnet layers 13 and the outer permanent magnet layers 15 are parasitic resistances. Therefore, by forming the low resistance layers 20 on the permanent magnet layers 13 and 15 as in this embodiment, the parasitic resistance can be decreased. In this embodiment, each of the connected-element bodies 14 includes the plurality of element units 12, the intermediate permanent magnet layers 13 are disposed between the element units 12, and the outer permanent magnet layers 15 are disposed outside the element units 12 located on both sides thereof in the element-length direction. Therefore, the upper surfaces of the permanent magnet layers 13 and 15 are exposed and thus the low resistance layers 20 can be easily and suitably formed on the upper surfaces of the permanent magnet layers 13 and 15.

FIG. 3 shows a structure of a sensor portion formed on an X-Z surface of the Z axis magnetic field detection unit 11 shown in FIG. 8.

The sensor portion includes a bridge circuit constituted by magnetoresistive effect elements 2 and 3 and fixed resistance elements 4 and 5. The structure of the magnetoresistive effect elements 2 and 3 has been described with reference to FIGS. 1A, 1B, 2, and 10.

The fixed resistance elements 4 and 5 are preferably serially connected to the magnetoresistive effect elements 2 and 3 through output extracting units 9, respectively. As shown in FIG. 3, the fixed resistance elements 4 and 5 each include a plurality of connected-element bodies 25 each formed by connecting a plurality of element units 24, whose electrical resistance value does not change in response to an external magnetic field, to each other with intermediate permanent magnet layers 13 therebetween. The ends of the connected-element bodies 25 are connected to each other with outer permanent magnet layers 15 therebetween so as to form a meandering shape. Without forming the fixed resistance elements 4 and 5 using only the element units 24, the fixed resistance elements 4 and 5 are formed by connecting the plurality of element units 24 to each other using the intermediate permanent magnet layers 13 and the outer permanent magnet layers 15 so as to form a meandering shape as with the magnetoresistive effect elements 2 and 3. Thus, the temperature coefficients of resistance (TCR) of the fixed resistance elements 4 and 5 can be adjusted to values close to those of the magnetoresistive effect elements 2 and 3.

The structure of the element units 24 constituting the fixed resistance elements 4 and 5 is not particularly limited as long as the resistance of the element units 24 does not change in response to an external magnetic field. The element units 24 are preferably composed of the same stacking components as those of the element units 12 constituting the magnetoresistive effect elements 2 and 3. Herein, the "stacking components" refer to individual layers of the antiferromagnetic layer 33, the fixed magnetic layer 34, the nonmagnetic layer 35, the free magnetic layer 36, and the protective layer 37 that constitute the magnetoresistive effect elements 2 and 3 and are shown in FIG. 10. Thus, the element units 24 include the antiferromagnetic layer 33, the fixed magnetic layer 34, the nonmagnetic layer 35, the free magnetic layer 36, and the protective layer 37, but are different from the element units 12 of the magnetoresistive effect elements 2 and 3, for example, in terms of the order of stacking as shown in FIG. 11. In the element units 24 constituting the fixed resistance elements 4 and 5, for example, the antiferromagnetic layer 33, the fixed magnetic layer 34, the free magnetic layer 36, the nonmagnetic layer 35, and the protective layer 37 are stacked in that order from the bottom. In this structure, since the free magnetic layer 36 is in contact with the fixed magnetic layer 34, the magnetization direction (F direction) of the free magnetic layer 36 is fixed in the fixed magnetization direction (P direction) of the fixed magnetic layer 34. Consequently, the magnetization direction is no longer changed in response to an external magnetic field and thus the free magnetic layer 36 can have fixed resistance.

When the element units 24 constituting the fixed resistance elements 4 and 5 have the same stacking components as those of the element units 12 constituting the magnetoresistive effect elements 2 and 3 and the fixed resistance elements 4 and 5 and the magnetoresistive effect elements 2 and 3 have the same shape shown in FIG. 3, electrical resistance values of the magnetoresistive effect elements 2 and 3 can be easily and suitably made substantially equal to those of the fixed resistance elements 4 and 5 in the state in which an external magnetic field is not provided, which easily provides a median potential. Furthermore, the temperature coefficients of resistance (TCR) of the fixed resistance elements 4 and 5 can be made substantially equal to those of the magnetoresistive effect elements 2 and 3. The same stacking components herein constitute a structure for providing the same temperature coefficient of resistance. Even if the order of layers stacked is changed or a magnetization direction is changed as described above, the same advantages can be produced.

As shown in FIG. 3, pad portions 26, 27, 28, and 29 electrically connected to the sensor portion that includes the magnetoresistive effect elements 2 and 3 and the fixed resistance elements 4 and 5 are preferably all formed in only an upper part relative to the sensor portion in the drawing. The pad portions 27 and 29 are output pads each connected to the output extracting unit 9 through a wiring layer. The pad portion 26 is an input pad and the pad portion 28 is a ground pad (the pad portions 26 and 28 may be replaced with each other).

By arranging all the pad portions 26 to 29 on only one side relative to the sensor portion, the pad portions 26 to 29 can be efficiently formed in a limited space, which can effectively downsize the magnetic sensor 1.

As also shown in FIG. 3, an input portion 31 of the bridge circuit can be easily connected to the input pad portion 26 through the wiring layer; a ground portion 30 of the bridge circuit can also be easily connected to the ground pad portion 28 through the wiring layer; and the output extracting units 9 can be easily connected to the pad portions 27 and 29 through the wiring layers, by closely disposing the outer permanent magnet layers 15 of the magnetoresistive effect elements 2 and 3 and the outer permanent magnet layers 15 of the fixed resistance elements 4 and 5 such that those outer permanent magnet layers 15 face each other or by using the outer permanent magnet layers 15 common to the magnetoresistive effect elements 2 and 3 and the fixed resistance elements 4 and 5.

The wiring layers and the pad portions 26 to 29 are composed of a nonmagnetic conductive material such as Au or Al. In the case where the low resistance layers 20 described using FIG. 2 are formed, the wiring layers, the pad portions 26 to 29, and the low resistance layers 20 can be formed in the same step.

As described above, the magnetic sensor 1 of this embodiment is used as the geomagnetic sensor shown in FIG. 8. The X axis magnetic field detection unit 6, the Y axis magnetic field detection unit 16, and the Z axis magnetic field detection unit 11 each include the sensor portion having the bridge circuit shown in FIG. 3. In the Z axis magnetic field detection unit 11, the fixed magnetization direction (P direction) of the fixed magnetic layer 34 of the element units 12 of the magnetoresistive effect elements 2 and 3 shown in FIG. 3 is the Z axis (sensitivity axis) direction. In the X axis magnetic field detection unit 6, the fixed magnetization direction (P direction) of the fixed magnetic layer 34 of the element units 12 of the magnetoresistive effect elements 2 and 3 is the X axis (sensitivity axis) direction. In the Y axis magnetic field detection unit 16, the fixed magnetization direction (P direction) of the fixed magnetic layer 34 of the element units 12 of the magnetoresistive effect elements 2 and 3 is the Y axis (sensitivity axis) direction.

The X axis magnetic field detection unit 6, the Y axis magnetic field detection unit 16, the Z axis magnetic field detection unit 11, and the application-specific integrated circuit (ASIC) 21 are disposed on the base 17. The magnetoresistive effect elements 2 and 3 of the X axis magnetic field detection unit 6 and the Y axis magnetic field detection unit 16 are each formed on an X-Y plane. On the other hand, the magnetoresistive effect elements 2 and 3 of the Z axis magnetic field detection unit 11 are formed on an X-Z plane. The X-Y plane is perpendicular to the X-Z plane.

The magnetic sensor 1 can be used as, for example, a magnetic switch and a potentiometer, in addition to a geomagnetic sensor.

The element units 12 constituting the magnetoresistive effect elements 2 and 3 may be an anisotropic magnetoresistive effect element (AMR element). However, if the element units 12 constituting the magnetoresistive effect elements 2 and 3 are a GMR or TMR element, the ratio (MR ratio) of change in resistance to an external magnetic field can be increased and the linearity of the MR ratio can be achieved, which can realize an external magnetic field detection with high precision.

In another embodiment shown in FIG. 4, soft magnetic materials 18 that each extend in the longitudinal direction (X direction) of the connected-element bodies 14 are disposed, when viewed in plan, in regions between the connected-element bodies 14 according to the embodiment shown in FIG. 1A and outside the connected-element bodies 14 that are located at the outermost positions in the element-width direction of the connected-element bodies 14. The length L3 of the soft magnetic materials 18 is larger than the length L2 of the connected-element bodies 14. By arranging the soft magnetic materials 18, an external magnetic field in the X direction can be blocked and the detection precision of a magnetic field in a sensitivity axis direction can be improved. The soft magnetic materials 18 are arranged on an insulating layer (not shown) that is provided from the upper side of the connected-element bodies 14 in order to fill the spaces between the connected-element bodies 14.

The embodiment shown in FIG. 4 differs from the embodiment shown in FIG. 1A in that the outer permanent magnet layers 15 disposed on both ends of each of the connected-element bodies 14 in the longitudinal direction are connected to each other through an electrode layer 19 composed of a good conductor such as Al, Au, or Cu. In the structure shown in FIG. 4, the magnetoresistive effect elements 2 and 3 and the fixed resistance elements 4 and 5 can have a meandering shape.

FIG. 5 shows a modification of FIG. 4. In the embodiment shown in FIG. 5, the magnetoresistive effect elements 2 and 3 have the following structure. Electrode layers 19 each connecting the ends of connected-element bodies 14 to each other are formed in a straight line (in a belt shape) so as to extend in the Z direction. The electrode layers 19 pass under an insulating layer formed below the soft magnetic materials 18. That is, the electrode layers 19 and the soft magnetic materials 18 intersect with each other in the height direction (Y direction of the drawing). The electrode layers 19 composed of a good conductor such as Al, Au, or Cu. The electrode layers 19 may be formed above the soft magnetic materials 18 as long as the electrode layers 19 are electrically insulated from the soft magnetic materials 18.

In FIG. 4, the electrode layers 19 are formed to make a detour around the soft magnetic materials 18 when viewed in plan. In contrast, in FIG. 5, the lengths of the electrode layers 19 and the soft magnetic materials 18 in the height direction (Z direction of the drawing) can be decreased and the wiring resistance of the electrode layers 19 that do not contribute to magnetoresistive effects can also be decreased, which improves sensor characteristics. Furthermore, the electrode layers 19 and the soft magnetic materials 18 are highly insulated from each other. Even if short circuits are established between the electrode layers 19 and the soft magnetic materials 18, short circuits are not established on the side opposite the side on which the electrode layers 19 intersect with the soft magnetic materials 18 because of the meandering shape. As a result, a by-pass circuit is not formed and thus the sensor characteristics are hardly affected. Since the electrode layers 19 are composed of a nonmagnetic good conductor, the parasitic resistance can be decreased compared with the structure in which permanent magnet layers are used instead of the electrode layers 19. If permanent magnet layers are used, a bias magnetic field affects the soft magnetic materials 18, which decreases a shield effect. However, such a problem is not caused in this embodiment.

As shown in a sectional view of FIG. 6, the antiferromagnetic layer 33, the fixed magnetic layer 34, and the nonmagnetic layer 35 constituting each of the element units 12 are not separated at positions where permanent magnet layers 13 and 15 are formed and have an integrated form. That is, depressed portions 63 are formed at the positions where permanent magnet layers 13 and 15 are to be formed, by removing the protective layer 37 and the free magnetic layer 36 constituting each of the element units 12 by ion milling or the like. Thus, the nonmagnetic layer 35 is exposed at bottom surfaces 63a of the depressed portions 63. The depressed portions 63 may be formed by removing the protective layer 37, the free magnetic layer 36, and part of the nonmagnetic layer 35. The permanent magnet layers 13 and 15 are formed in the depressed portions 63. Since the fixed magnetic layer 34 is not separated in the structure shown in FIG. 6, the magnetization of the fixed magnetic layer 34 can be stabilized in the Z direction of the drawing and thus the uniaxial anisotropy can be improved. In the structure in which the fixed magnetic layer 34 and the antiferromagnetic layer 33 are also separated and the permanent magnet layers 13 and 15 are disposed between the element units 12, the parasitic resistance tends to increase because the permanent magnet layers 13 and 15 and the element units 12 are electrically in contact with each other on the side surfaces thereof. However, since the permanent magnet layers 13 and 15 and the element units 12 are electrically in contact with each other in a planar manner in this embodiment, the parasitic resistance can be decreased.

As shown in FIG. 6, low resistance layers 20 having a resistance value lower than those of the intermediate permanent magnet layers 13 are formed on the upper surfaces of the intermediate permanent magnet layers 13. The low resistance layers 20 are suitably composed of a nonmagnetic conductor such as Au, Al, or Cu. The low resistance layers 20 are formed by sputtering or plating in the same manner as the intermediate permanent magnet layers 13. By forming the low resistance layers 20 on the intermediate permanent magnet layers 13 as shown in FIG. 6, the parasitic resistance components that do not contribute to a change in magnetoresistance can be effectively decreased.

If the element units 12 sandwiched between the permanent magnet layers 13 and 15 have a large aspect ratio (element length L1/element width W1) (refer to FIG. 7), a bias magnetic field generated from the permanent magnet layers 13 and 15 is not suitably provided to all of the element units 12. For this reason, when a magnetic field is made to act in the direction (X direction) perpendicular to the sensitivity axis direction and the magnetic field intensity is gradually increased, hysteresis easily occurs in a region in which the resistance changes. Therefore, since the region in which the resistance changes in response to the magnetic field (disturbance magnetic field) in the X direction is widened, the tolerance to the disturbance magnetic field is easily decreased. Thus, the aspect ratio of the element units 12 is preferably small to improve the tolerance to the disturbance magnetic field by suitably providing a bias magnetic field to all of the element units 12. Specifically, the aspect ratio of the element units 12 is preferably 3 or less and more preferably less than 1.

Example

The magnetoresistive effect element shown in FIGS. 1A and 1B was formed. Forty-two element units 12 were arranged in connected-element bodies 14, and intermediate permanent magnet layers 13 (CoPt) each having a thickness of 200 Å were disposed between the element units 12. Each of the element units 12 was formed by stacking an antiferromagnetic layer (IrMn, thickness: 60 Å), a fixed magnetic layer (CoFe, thickness: 20 Å), a nonmagnetic layer (Cu, thickness: 21 Å), a free magnetic layer (NiFe, thickness: 30 Å), and a protective layer (Ta, thickness: 30 Å) in that order from the bottom. The element width W1 of the element units 12 was 4 µm and the element length L1 was 16 µm. The width W3 of the intermediate permanent magnet layers 13 was 9 µm and the length L3 was 5 µm. Six of the connected-element bodies 14 were arranged so as to be adjacent to one another in the element-width direction with a space of 2 µm. The ends of the connected-element bodies 14 were connected to each other through outer permanent magnet layers 15 (CoPt) each having a thickness of 200 Å. The length L4 of the outer permanent magnet layers 15 was 10 µm. Thus, a magnetoresistive effect element having a meandering shape was formed.

Figure 12:
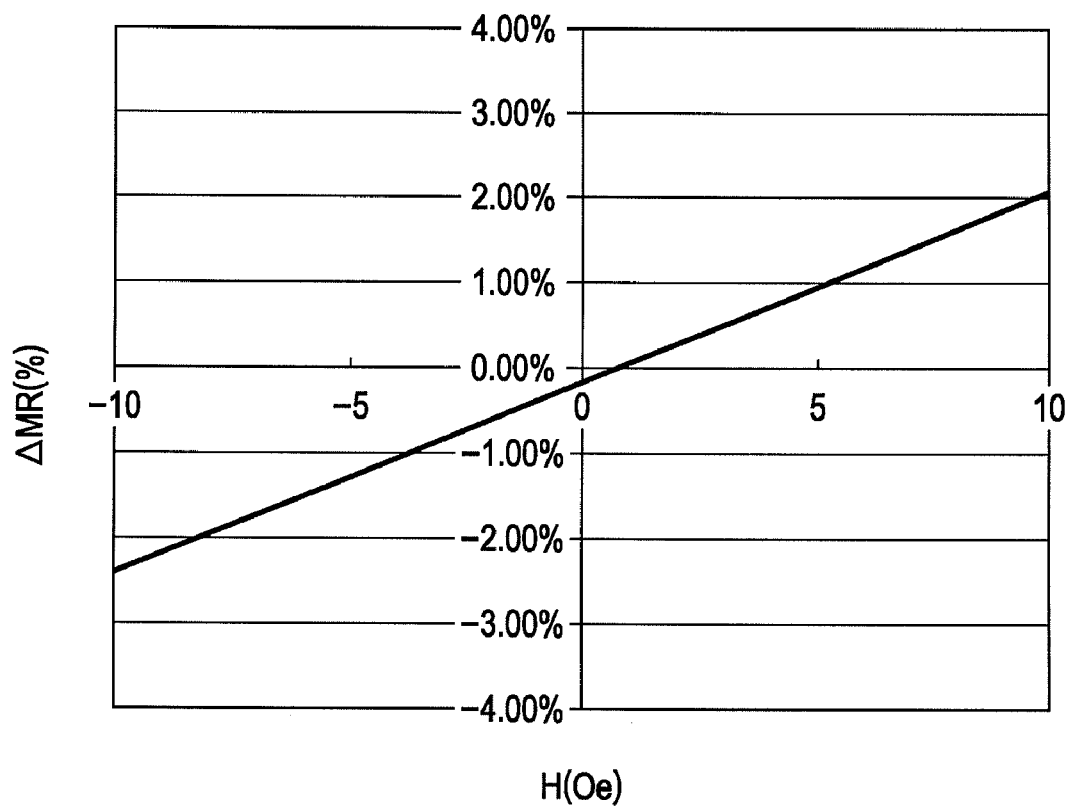
FIG. 12 is a graph showing the ratio (MR ratio) of change in resistance obtained when an external magnetic field of □ 10 Oe is provided to the magnetoresistive effect element having a meandering shape according to this embodiment in a sensitivity axis direction.
Figure 13:
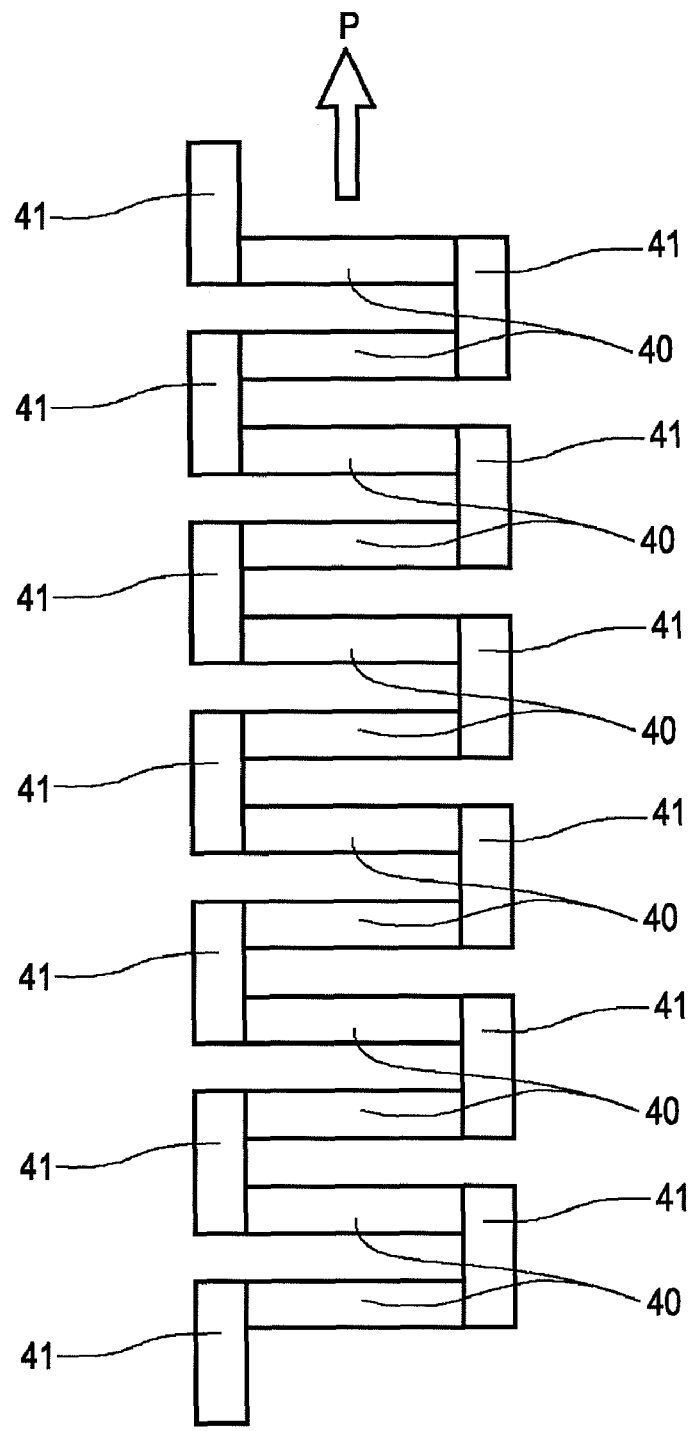
FIG. 13 is a partial plan view particularly showing a part of a magnetoresistive effect element of a publicly known magnetic sensor.
Figure 14:
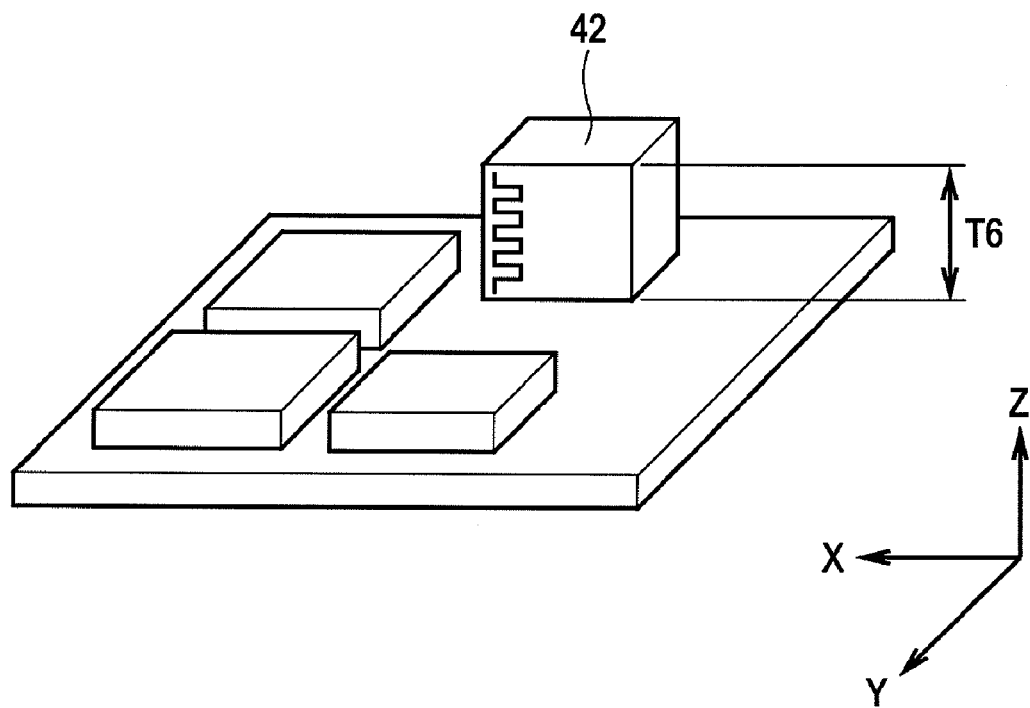
FIG. 14 is a partial perspective view of a publicly known geomagnetic sensor (magnetic sensor module).

The ratio (MR ratio) of change in resistance was measured by providing an external magnetic field of □ 10 Oe to the magnetoresistive effect element in an element-width direction, which is a sensitivity axis direction. FIG. 12 shows the results.

As shown in FIG. 12, the ratio (MR ratio) of change in resistance had satisfactory linearity particularly in the range of □ 5 Oe which is required for geomagnetic sensors. The MR ratio was about 0.2%/Oe in the range of □ 5 Oe. The linearity (% FS) was about 0.65%.

The invention claimed is:

1. A magnetic sensor comprising:
a magnetoresistive effect element,
wherein the magnetoresistive effect element includes a plurality of connected-element bodies arranged so as to be adjacent to one another in an element-width direction with a space therebetween and an outer permanent magnet layer disposed at ends of the connected-element bodies in a longitudinal direction, the ends of the connected-element bodies being electrically connected to each other with the outer permanent magnet layer therebetween to form a meandering shape;
the plurality of connected-element bodies each include a plurality of element units arranged in an element-length direction with a space therebetween and an intermediate permanent magnet layer disposed in the space, the element units being connected to each other so as to sandwich the intermediate permanent magnet layer; and
the element units each have an element width W1 and an element length L1 perpendicular to the element width W1 and produce a magnetoresistive effect in which electrical resistance changes in response to an external magnetic field.

2. The magnetic sensor according to claim 1, wherein a length L3 of the intermediate permanent magnet layer in the element-length direction is smaller than the element length L1 of the element units.

3. The magnetic sensor according to claim 1, wherein a length L3 of the intermediate permanent magnet layer in the element-length direction is smaller than a length L4 of the outer permanent magnet layer in the element-length direction.

4. The magnetic sensor according to claim 1, wherein a low resistance layer having a resistance value lower than that of the intermediate permanent magnet layer and that of the outer permanent magnet layer is formed on the intermediate permanent magnet layer and the outer permanent magnet layer.

5. The magnetic sensor according to claim 1, further comprising a fixed resistance element serially connected to the magnetoresistive effect element with an output extracting unit therebetween,
wherein the fixed resistance element includes a plurality of connected-element bodies each formed by connecting a plurality of element units, whose electrical resistance does not change in response to an external magnetic field, to each other with an intermediate permanent magnet layer therebetween in the same manner as the magnetoresistive effect element, and
the ends of the connected-element bodies are electrically connected to each other with an outer permanent magnet layer therebetween so as to form a meandering shape.

6. The magnetic sensor according to claim 5, wherein the element units constituting the fixed resistance element are composed of the same stacking component as that of the element units constituting the magnetoresistive effect element.

7. The magnetic sensor according to claim 5, wherein pad portions electrically connected to a sensor portion including the magnetoresistive effect element and the fixed resistance element are all formed on only one side relative to the sensor portion.

8. The magnetic sensor according to claim 1,
wherein the element units constituting the magnetoresistive effect element each include a fixed magnetic layer whose magnetization direction is fixed and a free magnetic layer whose magnetization direction is changed in response to an external magnetic field, the free magnetic layer being stacked on a nonmagnetic layer stacked on the fixed magnetic layer, and
a fixed magnetization direction of the fixed magnetic layer is the element-width direction, the element-width direction being a sensitivity axis direction.

9. A magnetic sensor module comprising:
a plurality of the magnetic sensors according to claim 1,
wherein magnetoresistive effect elements are arranged such that sensitivity axes of at least a pair of the magnetoresistive effect elements included in the plurality of the magnetic sensors are perpendicular to each other.

10. The magnetic sensor module according to claim 9,
wherein the magnetic sensor module is formed as a package having a substantially plate-like shape, and
a surface on which at least one of the magnetoresistive effect elements included in the plurality of the magnetic sensors is formed is perpendicular to a plate surface of the package.

11. The magnetic sensor module according to claim 9, wherein the magnetic sensor module is a geomagnetic sensor configured to detect geomagnetisms in directions of an X axis, a Y axis, and a Z axis (height direction), the X axis and the Y axis being perpendicular to each other in a plane, the plane being perpendicular to the Z axis.

* * * * *